(12) United States Patent
Hirose (10) Patent No.: US 7,265,963 B2
(45) Date of Patent: Sep. 4, 2007

(54) HOLDING MECHANISM OF OBJECT TO BE PROCESSED

(75) Inventor: Eiji Hirose, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/085,525

(22) Filed: Mar. 22, 2005

(65) Prior Publication Data

US 2005/0162805 A1   Jul. 28, 2005

Related U.S. Application Data

(62) Division of application No. 10/343,022, filed as application No. PCT/JP01/06420 on Jul. 26, 2001, now Pat. No. 6,878,233.

(30) Foreign Application Priority Data

Jul. 26, 2000   (JP) .............................. 2000-224905

(51) Int. Cl.
*H01L 21/306*   (2006.01)
(52) U.S. Cl. .................. 361/234; 156/345.28
(58) Field of Classification Search ........ 361/230–234; 156/345.28, 345.24
See application file for complete search history.

(56) References Cited

U.S. PATENT DOCUMENTS

| | | | |
|---|---|---|---|
| 5,433,813 A | | 7/1995 | Kuwabara |
| 5,557,215 A | | 9/1996 | Saeki et al. |
| 5,699,223 A | | 12/1997 | Mashiro et al. |
| 5,838,528 A | * | 11/1998 | Os et al. .................. 361/234 |
| 5,882,492 A | | 3/1999 | Manley et al. |
| 6,214,162 B1 | | 4/2001 | Koshimizu |
| 6,273,023 B1 | | 8/2001 | Tsuchihashi et al. |
| 6,431,115 B2 | | 8/2002 | Komino et al. |
| 6,557,248 B1 | * | 5/2003 | Shamouilian et al. ......... 29/825 |
| 6,608,746 B2 | * | 8/2003 | Ku .............................. 361/234 |
| 6,771,481 B2 | | 8/2004 | Nishio et al. |
| 6,878,233 B2 | * | 4/2005 | Hirose ................... 156/345.28 |
| 6,929,712 B2 | * | 8/2005 | Hanazaki et al. ...... 156/345.28 |
| 2003/0145950 A1 | | 8/2003 | Hirose |

FOREIGN PATENT DOCUMENTS

| | | |
|---|---|---|
| JP | 2000-92877 | 3/2000 |
| JP | 2002-43402 | 2/2002 |

* cited by examiner

*Primary Examiner*—Michael Sherry
*Assistant Examiner*—Danny Nguyen
(74) *Attorney, Agent, or Firm*—Oblon, Spivak, McClelland, Maier & Neustadt, P.C.

(57) ABSTRACT

According to the present invention, there is provided a holding mechanism of an object to be processed W, which comprises a relay switch to electrically disconnect a detection circuit having the function of detecting the stripped state of a protective film of a lower electrode and removing a residual charge from the direct-current component in a high-frequency power supply line from the power source supply line and which disconnects the detection circuit from the lower electrode in accordance with a process condition to prevent abnormal electric discharge and which electrically connects the detection circuit to the lower electrode to detect the stripped state (life) of the protective film of the lower electrode from the direct-current component in a plasma discharge or to remove a charge into the lower electrode or a residual charge during plasma processing under a process condition not causing abnormal electric discharge or at maintenance time.

12 Claims, 6 Drawing Sheets

HOLDING MECHANISM OF OBJECT TO BE PROCESSED

CROSS-REFERENCE TO RELATED APPLICATION

This application is a divisional of U.S. application Ser. No. 10/343,022, filed Jan. 27, 2003, now U.S. Pat. No. 6,878,322 which is a U.S. national phase application under 35 U.S.C. § 371 of International Application PCT/JP01/06420, filed Jul. 26, 2001, the entire contents of each of which are incorporated herein by reference.

TECHNICAL FIELD

The present invention relates to a holding mechanism of an object to be processed, which is mounted in a processing chamber of a plasma processing apparatus in order to hold the object to be processed.

BACKGROUND ART

In general, an electrostatic chuck using electrostatic adsorption is used in a holding mechanism of an object to be processed such as a semiconductor wafer in a plasma processing apparatus, and the electrostatically adsorbed object to be processed is subjected to a predetermined plasma process.

Figure 5:
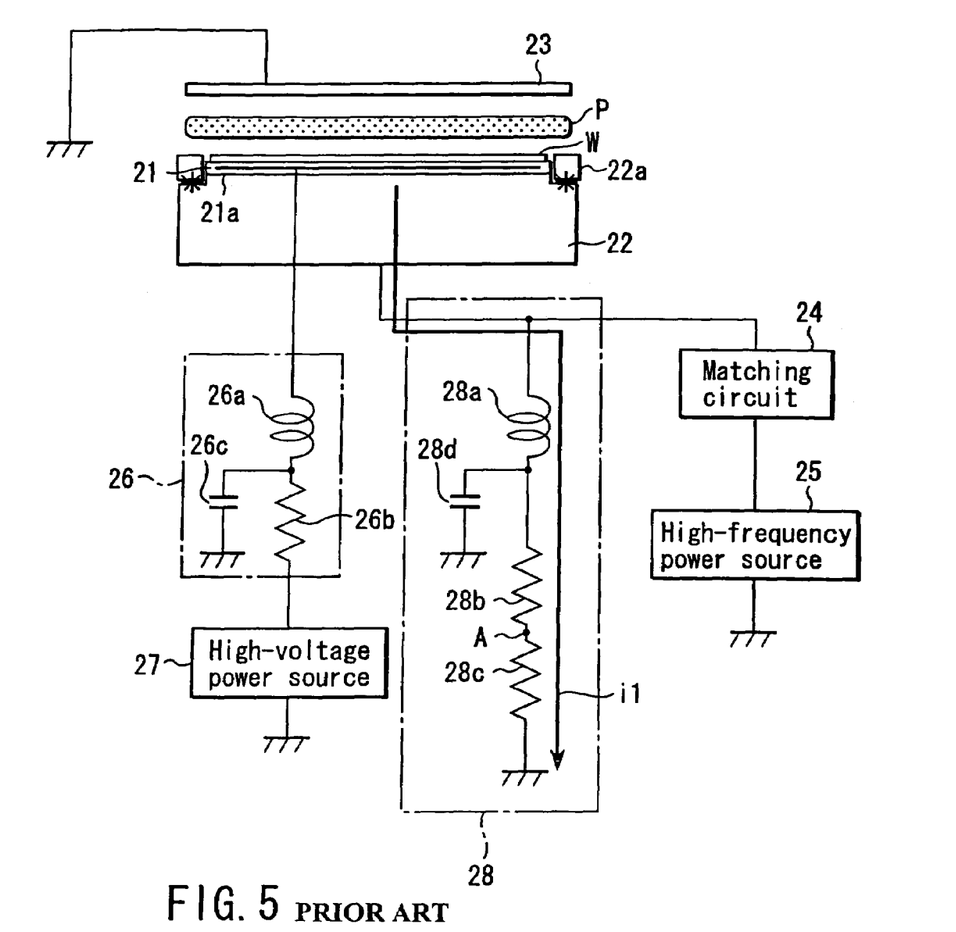
FIG. 5 is a constitution diagram showing one example of a related-art separated type of holding mechanism of the object to be processed.
Figure 6:
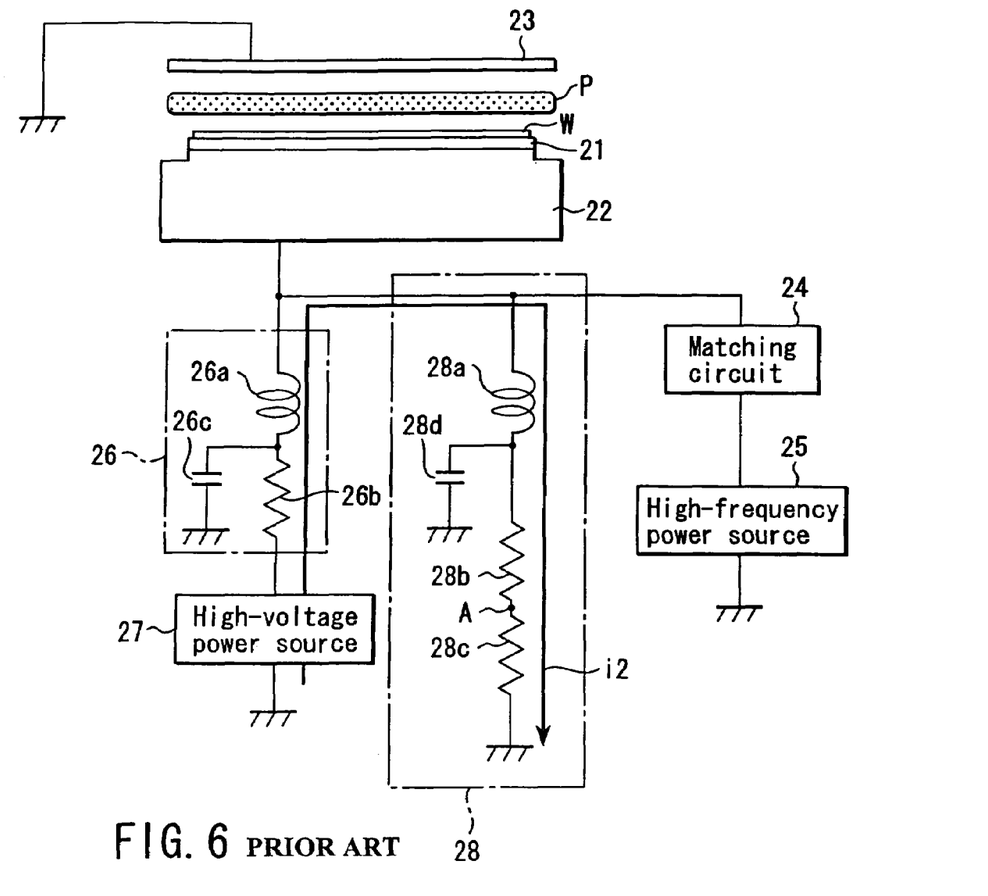
FIG. 6 is a constitution diagram showing one example of a related-art coupled type of holding mechanism of the object to be processed.

Examples of the holding mechanism of the object to be processed include two types including a type in which a high direct-current voltage is applied to an electrode plate disposed in the electrostatic chuck shown in FIG. 5, and a type in which the electrostatic chuck is held and a high direct-current voltage is applied to an electrode for generating plasma as shown in FIG. 6. For the sake of convenience, the former electrostatic chuck is referred to as a separated type, and the latter chuck is referred to as a coupled type.

As shown in FIG. 5, the separated type of holding mechanism of the object to be processed includes an electrostatic chuck 21 which electrostatically adsorbs the object to be processed (e.g., a semiconductor wafer), and a lower electrode 22 including aluminum whose surface is alumite-processed or coated with an insulating material such as ceramic. An upper electrode 23 is disposed above, parallel to, and opposite to the lower electrode 22 at a predetermined interval.

Moreover, the lower electrode 22 is connected to a high-frequency power source 25 via a matching circuit 24, high-frequency power is applied to the lower electrode 22 from the high-frequency power source 25, and plasma P is generated between the lower electrode 22 and upper electrode 23. This plasma P is collected onto a semiconductor wafer W via a focus ring 22a disposed in an outer peripheral edge of the lower electrode 22, and the semiconductor wafer is subjected to a plasma processing such as etching.

The electrostatic chuck 21 is formed by insulating materials such as a polyimide-based resin and ceramics, and an electrode plate 21a is disposed inside the chuck. The electrode plate 21a is connected to a high-voltage power source 27 which applies a direct-current voltage via a filter circuit 26, the high-voltage power source 27 applies a high direct-current voltage to the electrode plate 21a, and the semiconductor wafer is electrostatically adsorbed onto a front surface of the electrostatic chuck 21.

The filter circuit 26 includes, for example, a coil 26a, resistor 26b, and capacitor 26c, filters a high-frequency current from the high-frequency power source 25, and prevents the high-frequency current from turning onto a high-voltage power source 27 side.

Moreover, the lower electrode 22 is connected to a detection circuit 28. This detection circuit 28 measures a direct-current (DC) component generated in the lower electrode 22 to which the high-frequency power is applied. For example, as shown in FIG. 5, the circuit includes a coil 28a, resistor 28b, and capacitor 28c, and measures the direct-current component of a point A. At this measurement time, the circuit cuts the high-frequency current from the high-frequency power source 25, and prevents the high-frequency current from turning into the point A.

On the other hand, as shown in FIG. 6, the coupled type of holding mechanism of the object to be processed includes a constitution similar to that of the above-described separated type of holding mechanism of the object to be processed except that the lower electrode 22 also functions as the electrode plate of the electrostatic chuck 21. That is, the lower electrode 22 is connected to both the high-frequency power source 25 and high-voltage power source 27, and the high-frequency power source 25 applies the high-frequency power to the lower electrode 22 to generate the plasma P between the upper electrode 23 and lower electrode. Furthermore, the high-voltage power source 27 applies the high direct-current voltage to the lower electrode 22 to electrostatically charge the electrostatic chuck 21 and to electrostatically adsorb the semiconductor wafer.

Additionally, in addition to the function as the detection circuit of the direct-current component in the lower electrode 22 at the plasma processing time, the detection circuit 28 also has a function as a static eliminator circuit which eliminates charges remaining in capacitor components in the lower electrode 22 and matching circuit 24. For the separated type of holding mechanism of the object to be processed, a property as the static eliminator circuit is sometimes used to use the detection circuit 28 as life management means of the lower electrode 22.

That is, while the plasma processing is performed, the surface of the lower electrode 22 is sputtered, the alumite processing is scraped and stripped off, this stripped portion forms a closed circuit between the lower electrode 22 and upper electrode 23, and a current flows toward a detection circuit 28 side from the lower electrode 22.

When the current is measured by the detection circuit 28, the stripped degree (wear degree) of the lower electrode 22 by the sputtering can be grasped by the magnitude of the measured value, and further the life of the lower electrode 22 can be managed. The detection circuit 28 measures the direct-current component in the lower electrode 22, and the direct-current component is ideally in a 0V state at times other than times when the high-frequency power is turned ON/OFF or the high voltage is turned ON/OFF. Therefore, the current flowing through the lower electrode 22 at the plasma processing time can be grasped as the current which flows through the lower electrode 22 via the stripped alumite-processed portion. However, with the separated type of holding mechanism of the object to be processed shown in FIG. 5, depending on process conditions, while the semiconductor wafer is subjected to the plasma processing, for example, the detection circuit 28 functions as the static eliminator circuit, and a current i1 flows into the detection circuit 28 from the lower electrode 22. Therefore, a potential difference is generated between the lower electrode 22 and a focus ring 22a by the voltage drop of the lower electrode 22, and there has been a problem that this potential difference causes abnormal electric discharge between the lower electrode 22 and components such as the focus ring 22a.

To avoid this, when the detection circuit 28 is disconnected, the abnormal electric discharge at plasma processing time can be prevented, but there is a disadvantage that the charges remain in the lower electrode 22. Moreover, when refrigerant remains to be circulated in a refrigerant channel in the lower electrode 22 at maintenance time, static electricity is generated by friction of the refrigerant with the refrigerant channel, the lower electrode 22 is charged, and this causes a problem of electric shock.

Moreover, with the coupled type of holding mechanism of the object to be processed shown in FIG. 6, since a closed circuit is formed between the high-voltage power source 27 and detection circuit 28, as shown in the drawing, a current i2 constantly flows toward the detection circuit 28 from the high-voltage power source 27, the voltage applied to the lower electrode 22 from the high-voltage power source 27 drops, and there is a problem of deterioration of the electrostatic adsorption function of the electrostatic chuck 21. Furthermore, to avoid this, when the detection circuit 28 is disconnected, there is a problem of electrostatic charging in the lower electrode 22 in the same manner as in the separated type.

DISCLOSURE OF THE INVENTION

An object of the present invention is to provide a holding mechanism of an object to be processed, in which a voltage drop in an electrode can be prevented and the life of the electrode can be managed.

According to one aspect of the present invention there is provided a holding mechanism of an object to be processed mounted on a plasma processing apparatus which applies high-frequency power from a high-frequency power source to one of two electrodes disposed opposite to each other to generate plasma discharge, thereby subjecting the object to be processed to a plasma processing, the mechanism comprising: an electrostatic chuck which is attached to the electrode connected to the high-frequency power source and which electrostatically adsorbs the object to be processed; a high-voltage power source which applies a direct-current voltage to the electrostatic chuck to generate an electrostatic adsorption force; a detection circuit to detect a direct-current component generated on the electrode, when the high-frequency power is applied to the electrode to subject the object to be processed to the predetermined plasma processing; and a changeover switch which can electrically disconnect the detection circuit from the electrode at processing time of the object to be processed and which can electrically connect the detection circuit to the electrode at detection time of the direct-current component or at non-processing time of the object to be processed.

According to a further aspect, there is provided a holding mechanism of an object to be processed mounted on a plasma processing apparatus which applies high-frequency power from a high-frequency power source to one of two electrodes disposed opposite to each other to generate plasma discharge, thereby subjecting the object to be processed to a plasma processing, the mechanism comprising: an electrostatic chuck which is attached to the electrode connected to the high-frequency power source and which electrostatically adsorbs the object to be processed; a high-voltage power source which applies a direct-current voltage to the electrode and which generates an electrostatic adsorption force in the electrostatic chuck; a detection circuit to detect a direct-current component generated on the electrode, when the high-frequency power is applied to the electrode to subject the object to be processed to the predetermined plasma processing; and a changeover switch which can electrically disconnect the detection circuit from the electrode at processing time of the object to be processed and which can electrically connect the detection circuit to the electrode at detection time of the direct-current component or at non-processing time of the object to be processed.

BEST MODE FOR CARRYING OUT THE INVENTION

Embodiments of the present invention will be described hereinafter in detail with reference to the drawings.

Figure 1:
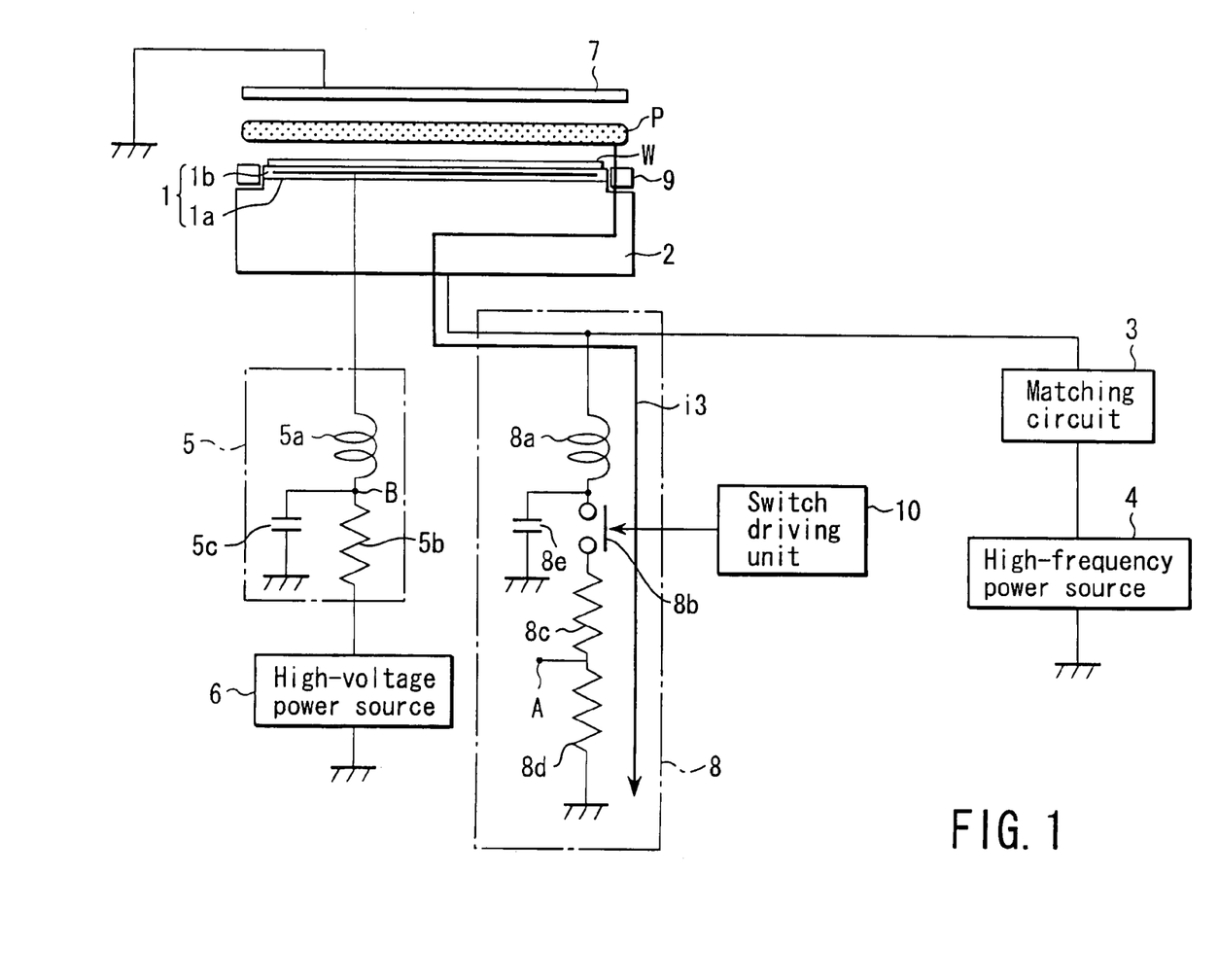
FIG. 1 is a diagram showing a constitution example of a separated type, according to a first embodiment of the present invention, of a holding mechanism of an object to be processed.

FIG. 1 is a diagram showing a constitution example of a separated type, according to a first embodiment of the present invention, of a holding mechanism of an object to be processed.

A holding mechanism of the object to be processed includes: a lower electrode 2, disposed opposite to an upper electrode 7, for generating plasma; an electrostatic chuck 1 which is disposed on the lower electrode 2 to electrostatically adsorb a semiconductor wafer W; a high-voltage power source 6 which applies a direct-current voltage for generating an electrostatic adsorption force in the electrostatic chuck 1; a filter circuit 5 which prevents a high-frequency current from turning toward the high-voltage power source 6; and a detection circuit 8 which detects a direct-current component generated in the lower electrode 2 in subjecting the semiconductor wafer W to plasma process. The mechanism further includes: a high-frequency power source 4 which applies high-frequency power for generating the plasma; and a matching circuit 3 which obtains the matching property in the output of the high-frequency power source 4 and removes a reflected current from the lower electrode.

The lower electrode 2 is formed of aluminum whose surface is alumite-processed or coated with an insulating material such as ceramic forming a protective film, and includes a focus ring 9 in an outer peripheral edge. Moreover, the upper electrode 7 is disposed above the lower electrode 2, and the lower electrode 2 and upper electrode 7 are disposed parallel to each other at a predetermined interval in a processing chamber (not shown).

The electrostatic chuck 1 is comprised of a chuck main body portion 1a formed of insulating materials such as a polyimide-based resin and ceramic, and an electrode plate 1b to which a direct-current voltage is applied from the high-voltage power source 6. For the filter circuit 5, for example, a coil 5a and resistor 5b are connected in series between the high-voltage power source 6 and lower electrode 2, a grounded capacitor 5c is connected to a connection point B, and the capacitor Sc filters the high-frequency current from the high-frequency power source 4 and prevents the high-frequency current from turning toward the high-voltage power source 6.

The detection circuit 8 is comprised of a coil 8a, relay switch 8b, and resistors 8c and 8d connected in series between the lower electrode 2 and ground, and further a grounded capacitor 8e is connected between the coil 8a and relay switch 8b. This relay switch 8b is a constantly opened contact point, and a switch driving unit 10 switches on (conduction)/off (non-conduction) based on the instruction of a control unit (not shown) which controls the whole apparatus (not shown).

In this constitution, the high-voltage power source 6 applies a high voltage to the electrode plate 1b via the filter circuit 5. In a state in which the semiconductor wafer W is electrostatically adsorbed by the electrostatic chuck 1, a predetermined process gas is supplied into the processing chamber from a gas supply system (not shown) to hold a predetermined vacuum degree. The high-frequency power source 4 applies high-frequency power to the lower electrode 2 via the matching circuit 3 and generates plasma between the lower electrode 2 and upper electrode 7, so that the semiconductor wafer W is subjected to the predetermined plasma processing.

Moreover, during the plasma processing by a process condition under which abnormal electric discharge easily occurs between the lower electrode 2 and components such as the focus ring 9, the relay switch 8b is brought into an open state (non-conducting state), and the flow of direct current into the detection circuit 8 is cut off. Furthermore, at stop time of the plasma processing, or maintenance time of the plasma processing apparatus, the detection circuit 8 is brought into a closed state (conducting state), and the current is allowed to flow into the detection circuit 8.

When the plasma processing is performed under a process condition easily causing the abnormal electric discharge in this manner, the relay switch 8b of the detection circuit 8 is opened. Therefore, the detection circuit 8 is electrically disconnected from the lower electrode 2 to cut off an input, voltage drop of the lower electrode 2 is prevented, and the abnormal electric discharge between the lower electrode 2 and the components such as the focus ring 9 can be prevented. Moreover, when the stripped degree of the alumite processing of the lower electrode 2 is to be detected during plasma processing not easily causing abnormal electric discharge, the relay switch 8b is closed, and the detection circuit 8 is electrically connected to the lower electrode 2.

If the lower electrode 2 is sputtered and a part of the alumite processing is scraped off, a closed circuit is formed between the stripped alumite-processed portion of the lower electrode 2 and the upper electrode 7, a current i3 flows into the detection circuit 8 from the lower electrode 2, and a voltage value can be detected at a measurement point A.

The stripped degree of the alumite-processed portion of the lower electrode 2 is grasped in accordance with the degree of increase of the voltage value, and further the life of the lower electrode 2 can be grasped and managed. Moreover, at maintenance time of the plasma processing apparatus, the relay switch 8b is closed to connect the detection circuit 8 to the lower electrode 2, and the detection circuit 8 is allowed to function as a static eliminator circuit. Thereby, when refrigerant is circulated in the lower electrode 2 at maintenance time, and even when static electricity is generated in the lower electrode 2, the static electricity can be eliminated by the static eliminator circuit without electrostatically charging the electrode.

An example of a coupled type of holding mechanism of the object to be processed according to a second embodiment will next be described with reference to FIGS. 2 and 4. Here, parts of the present embodiment equivalent to constituting parts shown in FIG. 1 are denoted with the same reference numerals, and description thereof is omitted. The above-described first embodiment includes the constitution in which the electrode plate 1b is disposed in the chuck main body 1a and the direct-current voltage is applied from the high-voltage power source 6, but the holding mechanism of the object to be processed of the present embodiment includes a constitution in which the electrode plate 1b is not disposed and the lower electrode 2 is used as the electrode plate 1b.

Figure 2:
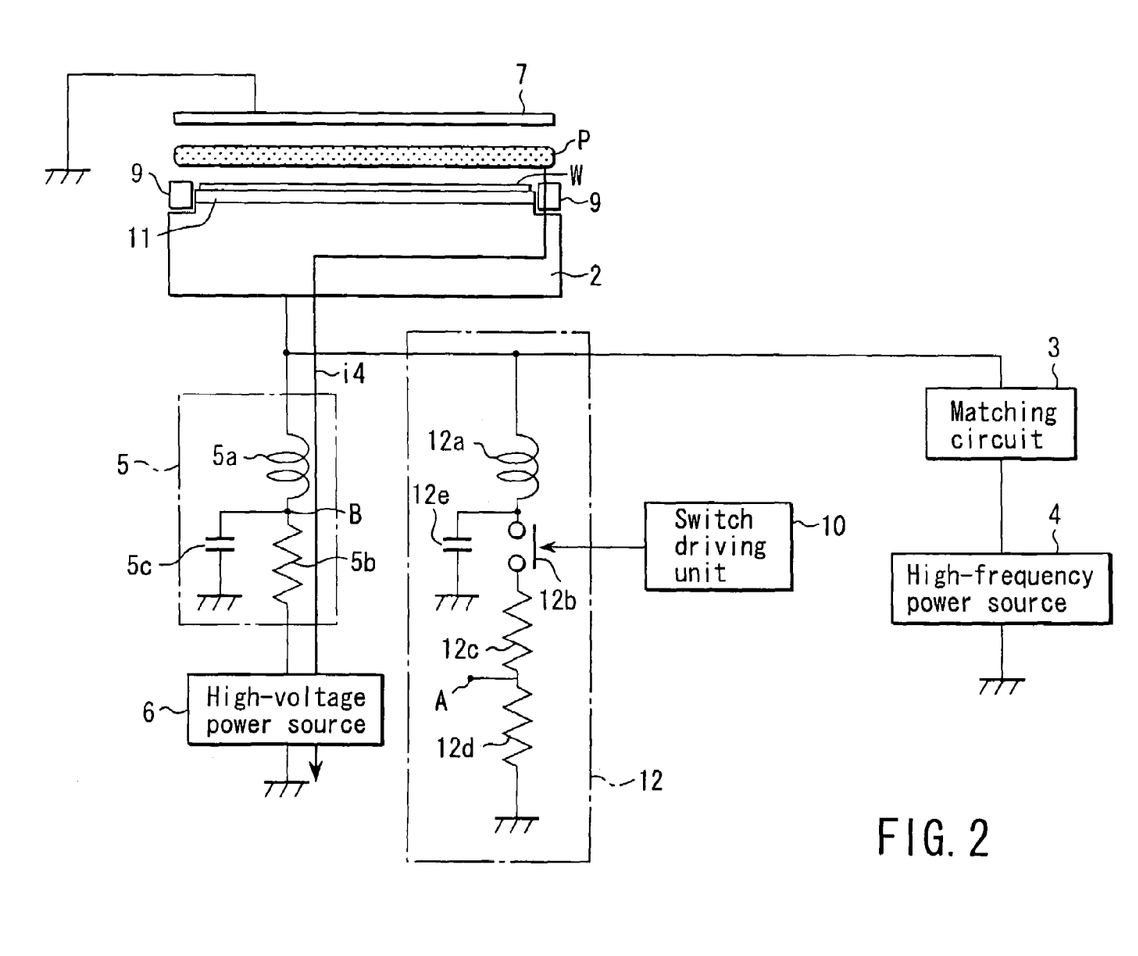
FIG. 2 is a diagram showing a constitution example of a coupled type, according to a second embodiment of the present invention, of the holding mechanism of the object to be processed.

The holding mechanism of the object to be processed shown in FIG. 2 includes: the lower electrode 2, disposed opposite to the upper electrode 7, for generating the plasma; an electrostatic chuck 11 which is disposed on the lower electrode 2 to electrostatically adsorb the semiconductor wafer W; the high-voltage power source 6 which applies the direct-current voltage to the lower electrode 2 to generate the electrostatic adsorption force in the electrostatic chuck 11; the filter circuit 5 which prevents the high-frequency current from turning toward the high-voltage power source 6; and the detection circuit 8 which detects the direct-current component generated in the lower electrode 2 in subjecting the semiconductor wafer W to the plasma processing. The mechanism further includes: the high-frequency power source 4 which applies the high-frequency power for generating the plasma; and the matching circuit 3 which obtains the matching property in the output of the high-frequency power source 4 and removes the reflected current from the lower electrode.

The above-described electrostatic chuck 11 is formed of insulating materials such as polyimide-based resin or ceramic. The chuck is different from the electrostatic chuck 1 of the above-described first embodiment in that an electrode plate is not disposed. Therefore, the chuck is disposed on the lower electrode 2 as the electrode plate, and the direct-current voltage is applied from the high-voltage power source 6 via the lower electrode.

A detection circuit 12 for use in the present embodiment includes substantially the same constitution as that of the detection circuit 8 of the above-described first embodiment, and is comprised of a coil 12a, relay switch 12b, and resistors 12c and 12d connected in series between the lower electrode 2 and ground, and further a grounded capacitor 12e is connected between the coil 12a and relay switch 12b. This relay switch 12b is a constantly opened contact point, and the switch driving unit 10 switches on (conduction)/off (non-conduction) based on the instruction of the control unit (not shown) which controls the whole apparatus (not shown).

The constitution is equal in this manner, but there is a different respect concerning function/effect.

First, as a common respect, at maintenance time, the relay switch 12b is closed, the detection circuit 12 is connected to the lower electrode 2, the detection circuit 12 is used as a static eliminator circuit, and charging in the lower electrode 2 can be prevented.

Different Respects will be Described.

In the present embodiment, at plasma processing time, the relay switch 12b is opened, the connection of the detection circuit 12 and lower electrode 2 is canceled, the connection of the detection circuit 12 and high-voltage power source 6 is also canceled, and the function of the static eliminator circuit is stopped. This prevents the high voltage in the lower circuit from dropping and can maintain the electrostatic adsorption function of the electrostatic chuck 11.

Additionally, to allow the detection circuit 12 to function as a life manager of the lower electrode 2, when the detection circuit 12 is connected to the lower electrode 2 via the relay switch 12b, as described also in the related art, the detection-circuit 12 and high-voltage power source 6 form a closed circuit, a high output voltage from the high-voltage power source 6 is measured instead of measuring the direct-current component of the lower electrode 2, and this constitution cannot be used as a life manager of the lower electrode 2 as such. The present inventors have found that the current of the high-voltage power source 6 is closely associated with the bias potential Vdc of the lower electrode 2.

Figure 3A:
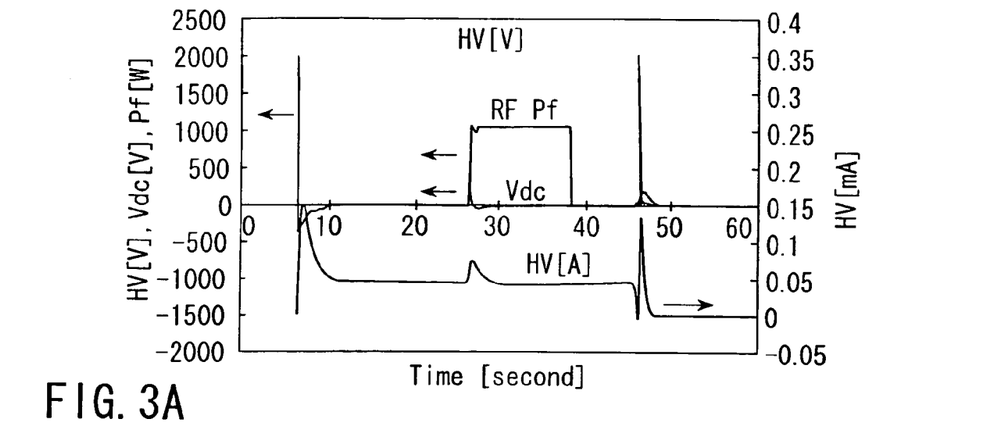
FIGS. 3A, 3B, 3C are diagrams showing the relationship between the current of a high-voltage power source and the bias potential of a lower electrode in the coupled type of holding mechanism of the object to be processed shown in FIG. 2.
Figure 3B:
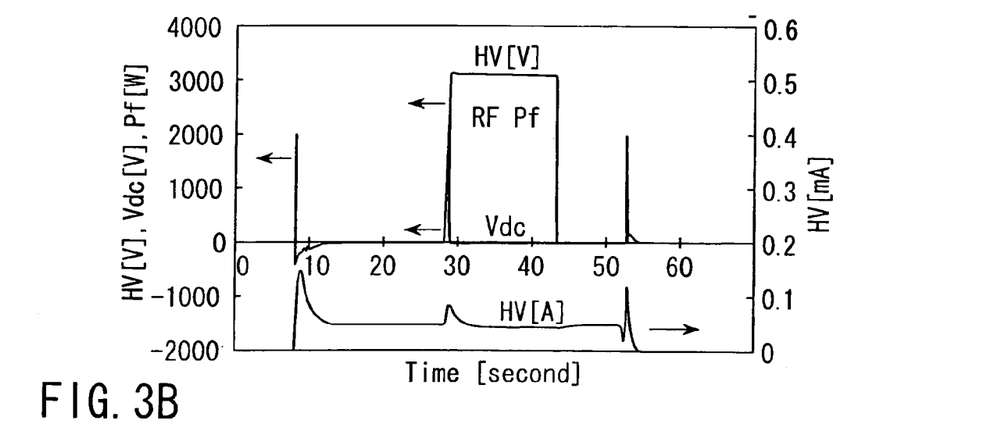
Figure 3C:
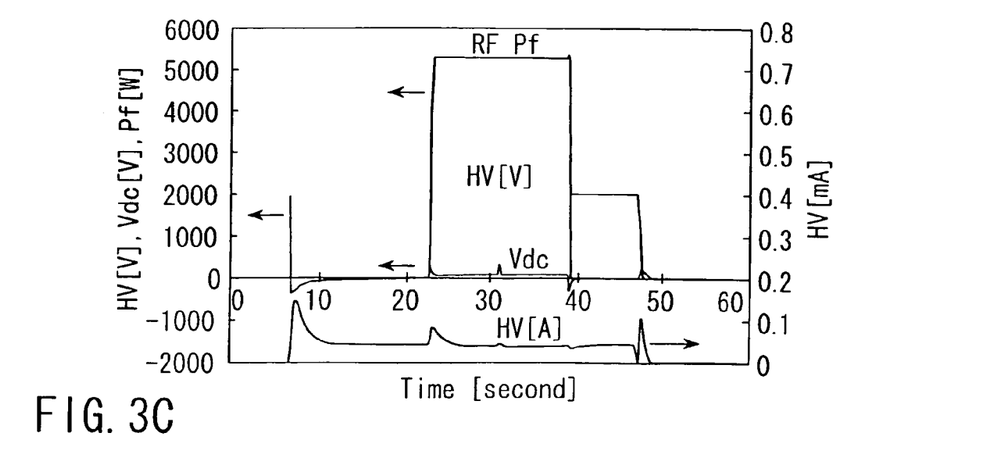

For example, as shown in FIGS. 3(a), (b), (c), the current HV[A] of the high-voltage power source 6 and bias potential Vdc of the lower electrode 2 change in synchronization with each other. It is further found that in synchronization with the application to the high-voltage power source 6 or high-frequency power source 4, the high-voltage current HV[A] and bias potential Vdc change.

Therefore, the lower electrode 2 and upper electrode 7 form a closed circuit via the stripped alumite-processed portion of the lower electrode 2, a current i4 flows into the high-voltage power source 6 from the lower electrode 2 as shown in FIG. 2, and the current HV[A] of the high-voltage power source 6 then changes. Therefore, in the second embodiment, the detection circuit 12 monitors the current HV[A] of the high-voltage power source 6 so that the current flowing through the stripped alumite-processed portion is indirectly grasped, and the life of the lower electrode 2 can be grasped and managed in accordance with the magnitude of the current.

Moreover, in the separated type of holding mechanism shown in FIG. 1, to manage the life of the lower electrode 2 when processing is performed under the process condition easily causing abnormal electric discharge, this current HV[A] can be monitored.

On the other hand, if the lower electrode 2 and upper electrode 7 form a closed circuit via the stripped alumite-processed portion of the lower electrode 2, then a voltage drop of the high voltage applied to the lower electrode 2 is caused, and there is also a possibility that the electrostatic chuck 11 does not function. Additionally, when the alumite-processed portion is stripped, there is a possibility of direct-current discharge caused by the high voltage applied to the lower electrode 2.

Figure 4:
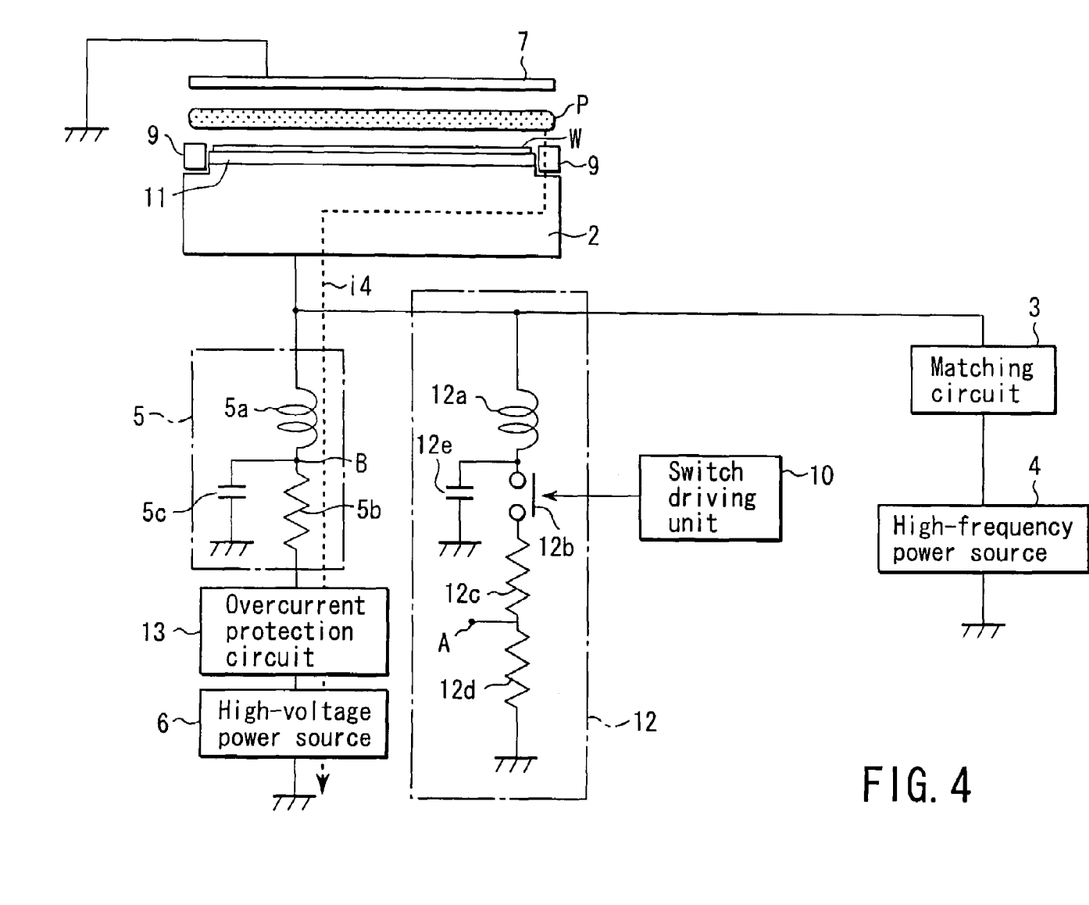
FIG. 4 is a diagram showing a modification example of the second embodiment shown in FIG. 2.

To solve the problem, as shown in FIG. 4, an overcurrent protection circuit 13 is disposed in a power source line of the high-voltage power source 6. This overcurrent protection circuit 13 stops the output of the high-voltage power source 6 when a predetermined or greater overcurrent is generated by the direct-current discharge. A measurement circuit which measures the overcurrent is incorporated in the high-voltage power source 6. Of course, the circuit may also be disposed outside. Furthermore, an alarm is given based on an overcurrent detection signal in the overcurrent protection circuit 13, and the output of the high-frequency power source 4 is stopped.

Therefore, when plasma processing is performed, the relay switch 12b of the detection circuit 12 is brought into an open state. Since the detection circuit 12 is not connected to the lower electrode 2, the high voltage of the lower electrode 2 is prevented from dropping, and the semiconductor wafer W can be prevented from being stripped from the electrostatic chuck 11.

Moreover, abnormal electric discharge between the lower electrode 2 and components such as the focus ring 9 can be prevented. When the stripped degree (life) of the alumite processing of the lower electrode 2 is to be grasped, the relay switch 12b is closed, and the detection circuit 12 is connected to the lower electrode 2.

At this time, if the lower electrode 2 is sputtered, and a part of the alumite processing is scraped off, a closed circuit is formed between the lower electrode 2 and upper electrode 7, and the current HV[A] of the high-voltage power source 6 is monitored. The current HV[A] is measured at the measurement point A, the life of the lower electrode 2 is grasped in accordance with the magnitude of this current HV[A], and further the life of the lower electrode 2 can be grasped and managed.

Moreover, at maintenance time of the plasma processing apparatus, the relay switch 12b is closed to connect the detection circuit 12 to the lower electrode 2, and the detection circuit 12 is allowed to function as a static eliminator circuit. Thereby, even when refrigerant is circulated in the lower electrode 2 at maintenance time, and static electricity is generated in the lower electrode 2, the static eliminator circuit can eliminate the static electricity. Moreover, even when a direct-current discharge is caused by the high voltage of the lower electrode 2 in the stripped alumite-processed portion of the lower electrode 2, the overcurrent protection circuit 13 detects the overcurrent of the high-voltage power source 6 and stops the driving of the high-voltage power source 6 and high-frequency power source 4, and the alarm can be given.

According to the above-described first and second embodiments, the relay switch 12b is disposed to electrically disconnect the detection circuits 8, 12 from the lower electrode 2 during a treatment in which abnormal electric discharge easily occurs and, on the other hand, to electrically connect the detection circuits 8, 12 to the lower electrode 2, when a direct-current component is detected and the semiconductor wafer W is not treated. Therefore, the following function/effect can be produced/obtained.

(1) Effect of First Embodiment

In the separated type of holding mechanism of the object to be processed, when the plasma processing is performed under the process condition easily causing abnormal electric discharge, the relay switch 8b of the detection circuit 8 is opened, and the detection circuit 8 is electrically disconnected from the lower electrode 2. Therefore, voltage drop of the lower electrode 2 is prevented, and abnormal electric discharge between the lower electrode 2 and components such as the focus ring 9 can be prevented.

Moreover, when the stripped degree of the alumite processing of the lower electrode 2 is to be grasped during the plasma processing under the process condition not causing abnormal electric discharge, the relay switch 8b is closed, and the detection circuit 8 is electrically connected to the lower electrode 2. Therefore, the stripped degree of the alumite-processed portion of the lower electrode 2 is grasped in accordance with the magnitude of the voltage value at the measurement point A, and further the life of the lower electrode 2 can be grasped and managed. Moreover, life management of the lower electrode 2 under the process condition under which abnormal electric discharge easily occurs can be performed by monitoring the current HV[A] of the direct-current high-voltage power source 6. Furthermore, in maintenance of the plasma processing apparatus, the relay switch 8b is closed to electrically connect the detection circuit 8 to the lower electrode 2, and the detection circuit 8 can be used as a static eliminator circuit. Therefore, charging in the lower electrode 2 at maintenance time is prevented, and an operator's short-circuit trouble can be prevented.

(2) Effect of Second Embodiment

In the coupled type of holding mechanism of the object to be processed, when the plasma processing is performed, the relay switch 12b of the detection circuit 12 opens, the detection circuit 12 is electrically disconnected from the lower electrode 2, and the voltage drop of the high voltage of the lower electrode 2 is prevented. The semiconductor wafer W can be prevented from being stripped from the electrostatic chuck 11, and further abnormal electric discharge between the lower electrode 2 and components such as the focus ring 9 can be prevented.

Moreover, to know the stripped degree of the alumite processing of the lower electrode 2 during the plasma processing, the current HV[A] of the high-voltage power source 6 is monitored to grasp the life of the lower electrode 2, and further the life of the lower electrode 2 can be grasped and managed. At maintenance time of the plasma processing apparatus, the relay switch 12b is closed to electrically connect the detection circuit 12 to lower electrode 2, the detection circuit 12 can be allowed to function as a static eliminator circuit, and charging in the lower electrode 2 can be prevented.

Moreover, according to the present embodiment, the overcurrent protection circuit 13 is disposed in the high-voltage power source 6 of the separated type of holding mechanism of the object to be processed. Therefore, even when the direct-current discharge occurs because of the high voltage of the lower electrode 2 in the stripped alumite-processed portion of the lower electrode 2, the overcurrent protection circuit 13 detects the overcurrent of the high-voltage power source 6, the high-voltage power source 6 and high-frequency power source 4 are stopped, and the alarm can be given.

It is to be noted that the present invention is not limited to the above-described respective embodiments, and design of each constituting element can appropriately be changed as needed.

INDUSTRIAL APPLICABILITY

An object of the present invention is to provide a holding mechanism of an object to be processed, which can prevent a voltage drop in an electrode and can manage the life of the electrode.

According to the present invention, for a detection circuit which has the function of detecting the stripped state of a protective film of an electrode from the direct-current component in a high-frequency power supply line and removing a residual charge, during plasma processing by a process condition under which abnormal electric discharge easily occurs, the detection circuit is electrically disconnected from a lower electrode so as to prevent abnormal electric discharge by the voltage drop of the lower electrode. During plasma processing by a process condition under which the abnormal electric discharge is not caused or at maintenance time, the detection circuit is electrically connected to the lower electrode in order to detect the stripped state (life) of the protective film of the electrode from the direct-current component in the plasma discharge, or to remove charges into the lower electrode or residual charges. Further, in the holding mechanism of the object to be processed, when overcurrent by direct-current discharge is generated from the lower electrode, and flows into a line of a high-voltage power source for generating an electrostatic adsorption force in an electrostatic chuck, an overcurrent protection circuit stops output of the high-voltage power source and high-frequency power source.

The invention claimed is:

1. A plasma processing apparatus which applies high-frequency power from a high-frequency power source to one of two electrodes disposed opposite to each other to generate plasma discharge, thereby subjecting an object to be processed to a plasma processing, the apparatus comprising:
    an electrostatic chuck which is attached to the electrode connected to the high-frequency power source and which electrostatically adsorbs the object to be processed;
    a high-voltage power source which applies a direct-current voltage to the electrostatic chuck to generate an electrostatic adsorption force;
    a circuit having at least one of a resistor, a capacitor, and a coil, said circuit being connected to the electrode; and
    a changeover switch which can electrically disconnect the circuit from the electrode at a processing time of the object to be processed and which can electrically connect the circuit to the electrode at a non-processing time of the object to be processed.

2. A plasma processing apparatus according to claim 1, wherein the changeover switch comprises a switch driving unit to electrically disconnect the circuit from the electrode, when the plasma processing is performed under a process condition easily causing abnormal electric discharge, and to electrically connect the circuit to the electrode and start a detection operation of the circuit, when a stripped degree of a protective film of the electrode is detected during the plasma processing under a process condition not causing the abnormal electric discharge.

3. A plasma processing apparatus according to claim 1, wherein the changeover switch comprises a switch driving unit to electrically connect the circuit to the electrode in a state in which the plasma is not generated and to pass a charge supplied to the electrode to ground.

4. A plasma processing apparatus according to claim 1, wherein the electrostatic chuck comprises: a chuck main body portion formed of an insulating material which is a polyimide-based resin or ceramic; and an electrode plate disposed in the chuck main body portion, and
    the object to be processed is held by an electrostatic adsorption force generated when the high-voltage power source applies the direct-current voltage to the electrode plate.

5. A plasma processing apparatus which applies high-frequency power from a high-frequency power source to one of two electrodes disposed opposite to each other to generate plasma discharge, thereby subjecting an object to be processed to a plasma processing, the apparatus comprising:
    an electrostatic chuck which is attached to the electrode connected to the high-frequency power source and which electrostatically adsorbs the object to be processed;

a high-voltage power source which applies a direct-current voltage to the electrode and which generates an electrostatic adsorption force in the electrostatic chuck;

a circuit having at least one of a resistor, a capacitor, and a coil, said circuit being connected to the electrode; and a changeover switch which can electrically disconnect the circuit from the electrode at a processing time of the object to be processed and which can electrically connect the circuit to the electrode at a non-processing time of the object to be processed.

6. A plasma processing apparatus according to claim 5, further comprising:

a measurement circuit which measures an overcurrent by the high-voltage power source; and an overcurrent protection circuit to stop output of the high-voltage power source and high-frequency power source and to give an alarm, when the measurement circuit measures overcurrent that equals or exceeds a predetermined overcurrent value.

7. A plasma processing method of a plasma processing apparatus which applies high-frequency power from a high-frequency power source to one of two electrodes disposed opposite to each other to generate plasma discharge, and which applies a direct-current voltage from a high-voltage power source to an electrostatic chuck to generate an electrostatic absorption force, thereby subjecting an object to be processed to a plasma processing, wherein:

the electrode to which the high-frequency power source is connected and a circuit connected to the electrode are electrically disconnectable at a processing time of the object to be processed, and the electrode and the circuit are electrically connectable at a non-processing time of the object to be processed, and the circuit is provided with at least one of a resistor, a capacitor, and a coil.

8. A plasma processing method according to claim 7, wherein the circuit is electrically disconnected from the electrode when the plasma processing is performed under a process condition easily causing abnormal electric discharge, and the circuit is electrically connected to the electrode and a detection operation of the circuit is started when a stripped degree of a protective film of the electrode is detected during the plasma processing under a process condition not causing the abnormal electric discharge.

9. A plasma processing method according to claim 7, wherein the circuit is electrically connected to the electrode in a state in which the plasma is not generated and a charge supplied to the electrode is passed to ground.

10. A plasma processing method according to claim 7, wherein the electrostatic chuck comprises: a chuck main body portion formed of an insulating material which is a polyimide-based resin or ceramic; and an electrode plate disposed in the chuck main body portion, and the object to be processed is held by an electrostatic adsorption force generated when the high-voltage power source applies the direct-current voltage to the electrode plate.

11. A plasma processing method of a plasma processing apparatus which applies high-frequency power from a high-frequency power source to one of two electrodes disposed opposite to each other to generate plasma discharge, and which applies a direct-current voltage from a high-voltage power source to the electrode to generate an electrostatic absorption force, thereby subjecting an object to be processed to a plasma processing, wherein:

the electrode to which the high-frequency power source is connected and a circuit connected to the electrode are electrically disconnectable at a processing time of the object to be processed, and the electrode and the circuit are electrically connectable at a non-processing time of the object to be processed, and the circuit is provided with at least one of a resistor, a capacitor, and a coil.

12. A plasma processing method according to claim 11, further comprising measuring an over-current by the high voltage power source using a measurement circuit; and output of the high-voltage power source and high-frequency power source are stopped and an alarm is given when the measurement circuit measures overcurrent that equals or exceeds a predetermined overcurrent value.

* * * * *